United States Patent
Peng et al.

(10) Patent No.: US 9,781,773 B2
(45) Date of Patent: Oct. 3, 2017

(54) METHOD OF HEATING/COOLING A SUBSTRATE

(71) Applicant: TAIWAN SEMICONDUCTOR MANUFACTURING COMPANY, LTD., Hsinchu (TW)

(72) Inventors: Jui-Chun Peng, Hsinchu (TW); Jacky Chung, Hsinchu (TW); Heng-Hsin Liu, Yonghe (TW); Chun-Hung Lin, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

(21) Appl. No.: 15/058,531

(22) Filed: Mar. 2, 2016

(65) Prior Publication Data

US 2016/0183329 A1     Jun. 23, 2016

Related U.S. Application Data

(62) Division of application No. 12/686,276, filed on Jan. 12, 2010, now Pat. No. 9,282,592.

(60) Provisional application No. 61/156,314, filed on Feb. 27, 2009.

(51) Int. Cl.
| | |
|---|---|
| *H01L 21/67* | (2006.01) |
| *H05B 3/14* | (2006.01) |
| *H01L 21/68* | (2006.01) |
| *H05B 1/02* | (2006.01) |
| *H05B 3/68* | (2006.01) |

(52) U.S. Cl.
CPC ....... *H05B 3/143* (2013.01); *H01L 21/67098* (2013.01); *H01L 21/67103* (2013.01); *H01L 21/67115* (2013.01); *H01L 21/67132* (2013.01); *H01L 21/67259* (2013.01); *H01L 21/681* (2013.01); *H05B 1/0233* (2013.01); *H05B 3/148* (2013.01); *H05B 3/68* (2013.01)

(58) Field of Classification Search
CPC ............. H01L 21/681; H01L 21/67103; H01L 21/67259; H01L 21/67115; H01L 21/67098; H05B 3/143; H05B 1/0233; H05B 3/148
See application file for complete search history.

(56) References Cited

U.S. PATENT DOCUMENTS

| | | |
|---|---|---|
| 6,575,737 B1 | 6/2003 | Perlov et al. |
| 6,753,508 B2 | 6/2004 | Shirakawa |
| 7,780,438 B2 | 8/2010 | Hayashi et al. |
| 8,314,371 B2 | 11/2012 | Sorabji et al. |
| 9,573,371 B2 * | 2/2017 | Hamaguchi .......... B41J 2/14201 |

(Continued)

*Primary Examiner* — Savitr Mulpuri
(74) *Attorney, Agent, or Firm* — Hauptman Ham, LLP

(57) ABSTRACT

A method of heating/cooling one or more substrates includes placing the one or more substrates on a rotatable hot-cold plate, wherein each substrate of the one or more substrates is placed on a corresponding sub-plate of a plurality of sub-plates of the rotatable hot-cold plate. The method further includes rotating the one or more substrates, wherein rotating the one or more substrates comprises rotating each substrate of the one or more substrates independently. The method further includes heating or cooling the one or more substrates using a heating-cooling element, wherein rotating the one or more substrates comprises rotating the one or more substrates relative to the heating-cooling element.

20 Claims, 3 Drawing Sheets

(56) References Cited

U.S. PATENT DOCUMENTS

| | | | |
|---|---|---|---|
| 9,583,377 B2* | 2/2017 | Chhatre | .................. H01L 21/70 |
| 2001/0013515 A1 | 8/2001 | Harada et al. | |
| 2007/0084832 A1 | 4/2007 | Wirth et al. | |
| 2008/0156785 A1 | 7/2008 | Ookura et al. | |
| 2008/0230534 A1 | 9/2008 | Winkler et al. | |
| 2008/0248657 A1* | 10/2008 | Nenyei | ............. H01L 21/67115 |
| | | | 438/799 |
| 2008/0280453 A1 | 11/2008 | Koelmel et al. | |
| 2009/0286407 A1 | 11/2009 | Yang | |

* cited by examiner

METHOD OF HEATING/COOLING A SUBSTRATE

PRIORITY CLAIM

The present application is a divisional of U.S. application Ser. No. 12/686,276, filed Jan. 12, 2010, which claims priority from U.S. Provisional Application No. 61/156,314, filed Feb. 27, 2009, the disclosures of which are hereby incorporated by reference herein in their entireties.

BACKGROUND

The disclosure relates generally to a hot/cold plate apparatus, and more particularly, to a hot/cold plate apparatus for improving the critical dimension uniformity of a substrate.

Controlling the critical dimension (CD) uniformity is becoming ever more important in integrated circuit manufacturing processes, particularly during photolithography processes as line widths of resist patterns fall within the deep sub-micron range. Various processing parameters, for example, the amount of exposure to light, developing time, and heating temperatures, affect the critical dimension uniformity.

In a lithography process, which typically includes one or more heating steps both before (pre-exposure heating) and after (post-exposure heating) the exposure step, the wafer or substrate is typically placed on or proximate to a hot plate, which includes several (often up to ten) individual heating elements for producing heat at various locations in the hot plate. The heat experienced by the photoresist layer formed over the substrate, however, is not always uniform. This non-uniform temperature distribution may be caused by various factors, for example, the distance the heat energy must travel through each media (e.g., from heating element to the top surface of the hot plate), and the condition of the hot plate surface (e.g., uniformly flat or smooth). The non-uniform temperature distribution across the photoresist layer may lead to localized variations in critical dimensions (e.g., profile shape and line and space width of the photoresist pattern), which may lead to low device yields.

Just as important as the uniform temperature distribution is for a substrate during a heating event, the temperature distribution across the substrate should be sufficiently uniform during a cooling event in order to prevent damage to the substrate such as warpage or cracking.

For these reasons and other reasons that will become apparent upon reading the following detailed description, there is a need for an improved hot/cold plate apparatus and method for uniformly heating/cooling a substrate that avoids the critical dimension uniformity issue associated with conventional hot/cold plates.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
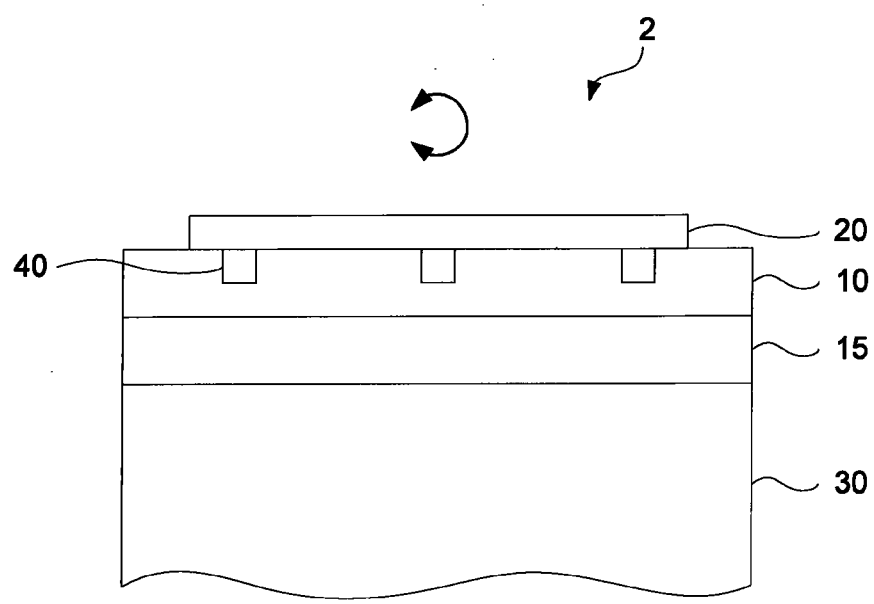
FIG. 1 is a cross-sectional view of a hot/cold plate apparatus according to one embodiment of the present invention.

FIG. 1 is a cross-sectional view of a hot/cold plate apparatus 2 according to one embodiment of the present invention. The hot/cold plate apparatus 2 includes a hot/cold plate 10 onto which a substrate 20 is placed. The substrate 20 may be a semiconductor substrate, a photomask blank, or other types of substrates that may be supported and heated/cooled. The hot/cold plate 10 may be an aluminum plate, a copper plate, a metal alloy plate, a ceramic plate, or a plate made out of a material capable of conducting thermal energy. The hot/cold plate 10 may also include a protective coating thereover comprising quartz, sapphire, aluminum oxide, or boron nitride, for example. Depending on the configuration of the substrate 20 being heated or cooled and the heating/cooling source used for heating/cooling, the hot/cold plate 10 may have various configurations such as a rectangle, a ellipse, a circle, etc. In one exemplary embodiment of the present disclosure, the hot/cold plate 10 is disc-shaped having a thickness of from about 0.5 mm to about 3 mm and a diameter of about 340 mm to accommodate a wafer having a thickness of 750 μm and a diameter from about 300 mm to about 340 mm. As is understood by those skilled in the art, the thickness of the hot/cold plate depends on the diameter and thickness of the particular wafer to be placed thereon for processing.

A heating/cooling element 30 provides heating or cooling to the hot/cold plate 10, which in turn provides heating/cooling to the substrate 20. As is shown in FIG. 1, the heating/cooling element 30 is positioned below the hot/cold plate 10. In one embodiment, the heating/cooling element 30 may be concentric or spiral in shape and attached to the underside of the hot/cold plate 10. However, in other embodiments, the heating/cooling element 30 may be disposed proximal to the hot/cold plate 10 such as being embedded within the hot/cold plate 10.

A controller (not shown) activates a voltage source (not shown) to allow a current to flow through a power line into the heating/cooling element 30. The current flowing through the heating/cooling element 30 is converted to heat that is transferred to the hot/cold plate 10 and the substrate 20 is thereafter heated. The heating continues for a pre-determined time (e.g., until the photosensitive resin on the substrate is sufficiently dried), after which the heating/cooling elements 30 are de-energized.

In the event that cooling a substrate is desired, the hot/cold plate 10 may include one or more conduits (not shown) in the hot/cold plate 10 for transporting cooling fluid such as water or gas therethrough to generally provide cooling to the substrate 20. The gas may include, for example, one or more of substantially thermally conductive and thermally non-conductive gases, such as helium, argon, and nitrogen. It is understood that alternative heating/cooling structures and/or sources may be employed within the teachings of the present disclosure without departing from its broader scope and spirit.

With reference still to FIG. 1, the hot/cold plate 10 may also include one or more temperature sensors 40. Temperature sensors 40 may be embedded in or bonded to the hot/cold plate in one embodiment and may comprise one or more pyrometric sensors or one or more fiber-optic sensors, for example. Temperature sensors 40 are operable to measure one or more temperatures at one or more respective locations associated with a substrate or a plurality of substrates. Each of the temperature sensors 40 may also employ a relay signal to the controller (not shown). The controller is operable to control the amount of heating or cooling to the hot/cold plate 10 by controlling a voltage source (not shown) or a tunable gas source (not shown), for example, at least in part on the signals associated with the one or more measured temperatures from the temperature sensors 40. For example, where uneven heating is detected by a particular temperature sensor at a particular location on the substrate 20, the controller may control the voltage source (not shown) to allow more current to flow through a power line into the heating/cooling element 30. The current flowing through the heating/cooling element 30 is converted to heat that is then transferred to the hot/cold plate 10.

To reduce the critical dimension (CD) uniformity error typically resulting from the non-uniform temperature distribution of a substrate and avoid hot/cold spots on the substrate surface, an aspect of the present disclosure provides that the substrate 20 be rotated about an axis to provide an approximately uniform temperature distribution across its surface during a heating or cooling event. As shown in FIG. 1, by coupling the hot/cold plate 10 to a rotating element 15, a source of rotation is provided to the substrate 20. The rotating element 15 is operable to rotate hot/cold plate 10 bi-directionally and may comprise, for example, 1) a drive shaft driven by an electric motor, an electromechanical drive motor, or a pneumatic motor, or 2) the drive shaft and a gear assembly, operable to translate rotation to the hot/cold plate 10.

Figure 2:
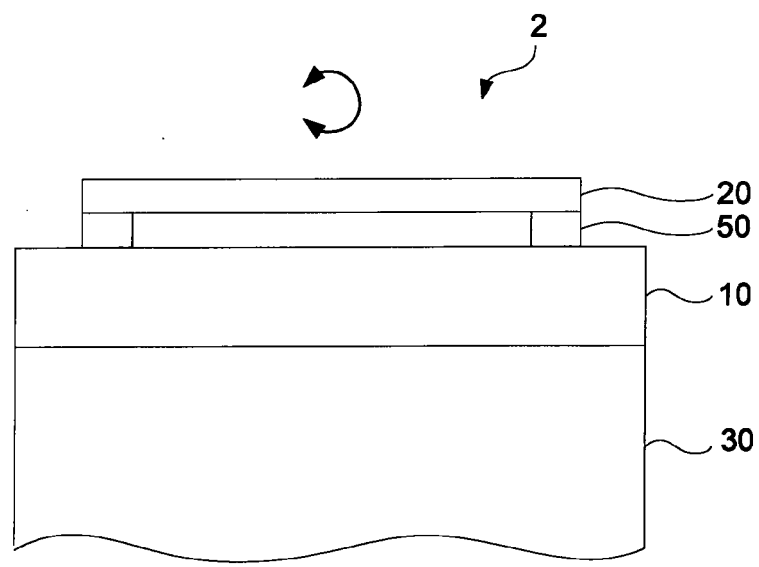
FIG. 2 is a cross-sectional view of a hot/cold plate apparatus, according to another embodiment of the present invention.
Figure 3:
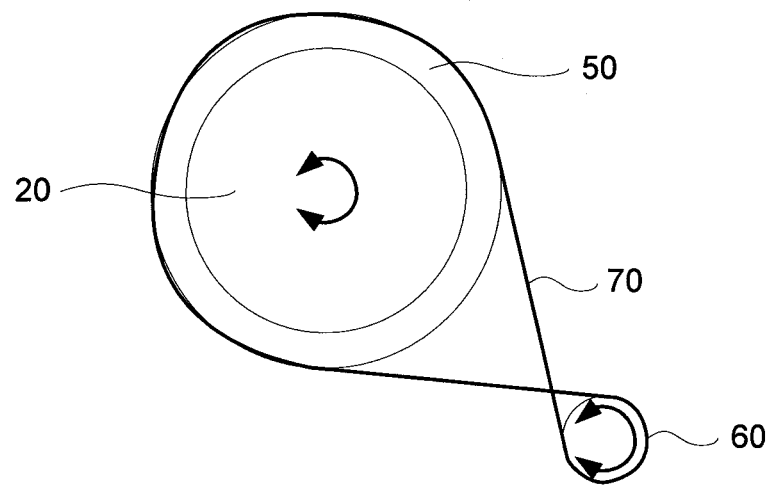
FIG. 3 is a top view of a gear apparatus for imparting rotation to a substrate, according to one embodiment of the present invention.

Alternatively, the substrate 20 itself may be rotated bi-directionally by a ring type holder 50 in a hot/cold plate apparatus, as illustrated in FIG. 2. The ring type holder 50 is operably coupled to a gear or pulley mechanism that imparts rotation to the ring type holder 50. FIG. 3 shows a top view of the ring type holder 50 gear apparatus, according to one embodiment of the present invention. The ring type holder 50 is positioned below and generally coaxially with the substrate 20 having a diameter proximate to the diameter of the substrate 20, wherein the ring type holder 50 is operable to radially constrain the substrate 20. A motor 60 imparts rotational energy to the ring type holder 50 via a pulley belt 70, which then rotates the substrate 20.

Figure 4:
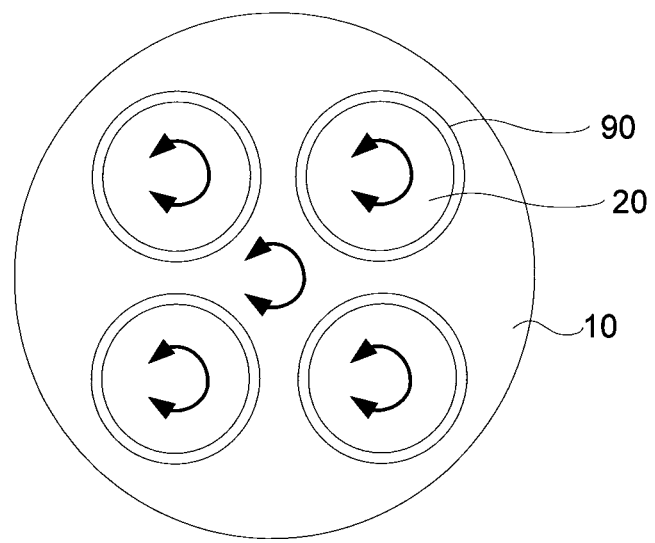
FIG. 4 is a top view of a hot/cold plate having a plurality of sub-plates thereon, according to one embodiment of the present invention.

As shown in FIG. 4, a top-down view, the rotatable hot/cold plate 10 may include one or more sub-plates 90 for receiving one or more substrates 20. Rotational means engageably couples to the hot/cold plate to ensure that each of the plurality of sub-plates 90 rotates bi-directionally. Each sub-plate 90 may be rotating independently whilst the hot/cold plate 10 may be rotating or not.

According to one embodiment of the present invention, the ring type holder 50 may include one or more sub-plates 90, the sub-plates being capable of rotating bi-directionally. Those skilled in the art understands that alternative sources for rotating a substrate or a plurality of substrates disposed in sub-plates may be employed within the teachings of the present disclosure without departing from its broader spirit and scope.

Figure 5:
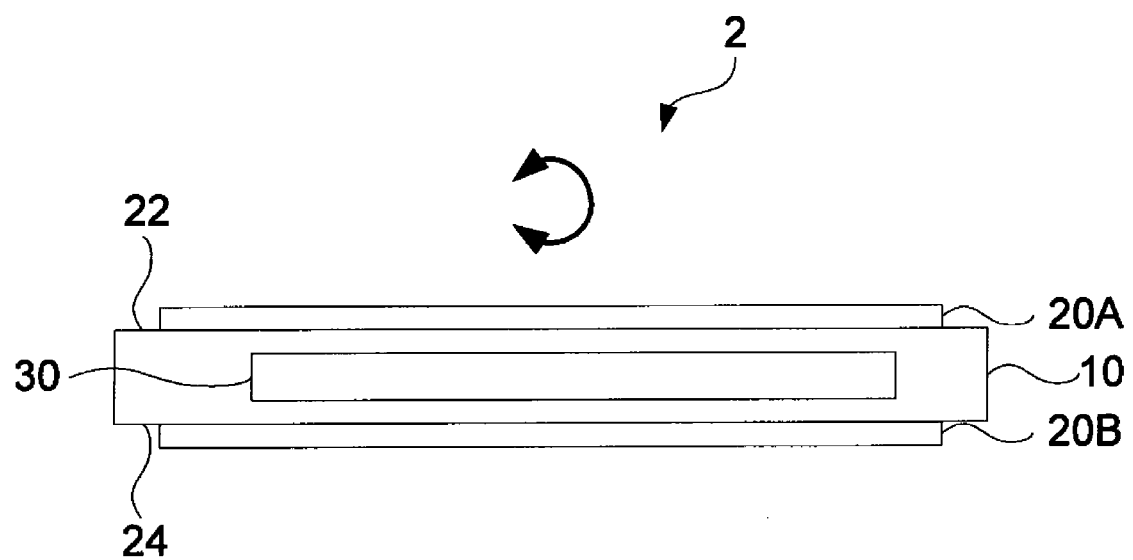
FIG. 5 is a cross-sectional view of a hot/cold plate apparatus for affixing one or more substrates over the surfaces of the hot/cold plate, according to one embodiment of the present invention.

FIG. 5 is a cross-sectional view of a portion of a hot/cold plate apparatus 2 for affixing one or more substrates over the surfaces of the hot/cold plate 10, according to one embodiment of the present invention. By having two or more substrates rotate at the same time during a heating or cooling event, the cycle time can be reduced. In one embodiment, the hot/cold plate 10 has a first surface 22 for receiving a first substrate 20A and a second surface 24 for receiving a second substrate 20B. In another embodiment, the first surface 22 of the hot/cold plate 10 includes one or more sub-plates for receiving one or more substrates and the second surface 24 includes one or more sub-plates for receiving one or more substrates. In another embodiment, the hot/cold plate apparatus 2 includes a robot mechanism (not shown) operable to position and remove substrates from the hot/cold plate 10. In yet another embodiment, the hot/cold plate apparatus 2 includes a ring type holder (not shown) disposed on the first and the second surfaces 22 and 24, each for receiving the first substrate 20A and the second substrate 20B, respectively each ring type holder operably coupled to a gear or pulley mechanism for imparting rotation to the ring type holders. In another embodiment, each ring type holder of the hot/cold plate apparatus 10 includes one or more sub-plates for receiving one or more substrates.

Aspects of the present disclosure provide several advantages. In a heating event, by controlling the temperature distribution of a wafer to be as uniform as possible, the critical dimension (CD) uniformity improves thereby improving the device yield. This temperature distribution uniformity may also reduce hot spots, which can occur in existing systems.

In a cooling event, by managing the temperature distribution of a wafer to be as uniform as possible, possible damage to the wafer such as warpage or cracking can be avoided.

One aspect of this description relates to a method of heating/cooling one or more substrates. The method includes placing the one or more substrates on a rotatable hot-cold plate, wherein each substrate of the one or more substrates is placed on a corresponding sub-plate of a plurality of sub-plates of the rotatable hot-cold plate. The method further includes rotating the one or more substrates, wherein rotating the one or more substrates comprises rotating each substrate of the one or more substrates independently. The method further includes heating or cooling the one or more substrates using a heating-cooling element, wherein rotating the one or more substrates comprises rotating the one or more substrates relative to the heating-cooling element.

Another aspect of this description relates to a method of heating/cooling a plurality of substrates. The method includes placing a first substrate of the plurality of substrates on a first surface of a hot/cold plate. The method further includes placing a second substrate of the plurality of substrates on a second surface of the hot/cold plate. The method further includes rotating the first and second substrates, wherein rotating the first and second substrates comprises rotating the first and second substrates independently. The method further includes heating or cooling the first and second substrates using a heating-cooling element, wherein rotating the first and second substrates comprises rotating the first and second substrates relative to the heating-cooling element.

Still another aspect of this description relates to a method of heating/cooling a plurality of substrates. The method includes placing a first substrate of the plurality of substrates on a first surface of a hot/cold plate. The method further includes placing a second substrate of the plurality of substrates on a second surface of the hot/cold plate, wherein the first surface is opposite the second surface. The method further includes placing a third substrate of the plurality of substrates on the first surface of the hot/cold plate. The method further includes rotating the first, second and third substrates, wherein rotating the first, second and third substrates comprises rotating the first, second and third substrates independently. The method further includes heating or cooling the first, second and third substrates using a heating-cooling element, wherein rotating the first, second and third substrates comprises rotating the first, second and third substrates relative to the heating-cooling element.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of heating/cooling one or more substrates, the method comprises:
    placing the one or more substrates on a rotatable hot-cold plate, wherein each substrate of the one or more substrates is placed on a corresponding sub-plate of a plurality of sub-plates of the rotatable hot-cold plate;
    rotating the one or more substrates, wherein rotating the one or more substrates comprises rotating each substrate of the one or more substrates independently; and
    heating or cooling the one or more substrates using a heating-cooling element, wherein rotating the one or more substrates comprises rotating the one or more substrates relative to the heating-cooling element.

2. The method of claim 1, further comprising measuring one or more temperatures at corresponding locations associated with the one or more substrates.

3. The method of claim 1, wherein rotating the one or more substrates comprises rotating the one or more substrates bi-directionally.

4. The method of claim 1, wherein rotating the one or more substrates comprises rotating the one or more substrate using a motor, a drive shaft and a gear assembly.

5. The method of claim 1, wherein rotating the one or more substrates comprises rotating the one or more substrates using a ring type holder.

6. The method of claim 1, wherein placing the one or more substrates comprises placing the one or more substrates using a robot mechanism.

7. The method of claim 1, wherein rotating the one or more substrates comprises rotating each sub-plate of the plurality of sub-plates and independently rotating the hot-cold plate.

8. The method of claim 1, wherein placing the one or more substrates comprises placing a first substrate of the one or more substrates on a first side of the hot-cold plate, and placing a second substrate of the one or more substrates on a second side of the hot-cold plate opposite the first side.

9. The method of claim 1, further comprising controlling the heating-cooling element based on temperature information detected by temperature sensors embedded in the hot-cold plate.

10. A method of heating/cooling a plurality of substrates, the method comprises:
    placing a first substrate of the plurality of substrates on a first surface of a hot/cold plate;
    placing a second substrate of the plurality of substrates on a second surface of the hot/cold plate;
    rotating the first and second substrates, wherein rotating the first and second substrates comprises rotating the first and second substrates independently; and
    heating or cooling the first and second substrates using a heating-cooling element, wherein rotating the first and second substrates comprises rotating the first and second substrates relative to the heating-cooling element.

11. The method of claim 10, wherein placing the second substrate on the second surface comprises placing the second substrate on the second surface opposite the first surface.

12. The method of claim 10, wherein placing the second substrate on the second surface comprises placing the second substrate on the second surface adjacent to the first surface.

13. The method of claim 10, further comprising measuring one or more temperatures at corresponding locations associated with the one or more substrates.

14. The method of claim 10, wherein rotating the first and second substrates comprises rotating the first and second substrates bi-directionally.

15. The method of claim 10, wherein rotating the first and second substrates comprises rotating the first and second substrate using a motor, a drive shaft and a gear assembly.

16. The method of claim 10, wherein rotating the first and second substrates comprises rotating the first and second substrates using a ring type holder.

17. The method of claim 10, further comprising controlling the heating-cooling element based on temperature information detected by temperature sensors embedded in the hot-cold plate.

18. A method of heating/cooling a plurality of substrates, the method comprises:
    placing a first substrate of the plurality of substrates on a first surface of a hot/cold plate;
    placing a second substrate of the plurality of substrates on a second surface of the hot/cold plate, wherein the first surface is opposite the second surface;
    placing a third substrate of the plurality of substrates on the first surface of the hot/cold plate;

rotating the first, second and third substrates, wherein rotating the first, second and third substrates comprises rotating the first, second and third substrates independently; and heating or cooling the first, second and third substrates using a heating-cooling element, wherein rotating the first, second and third substrates comprises rotating the first, second and third substrates relative to the heating-cooling element.

19. The method of claim 18, further comprising placing a fourth substrate of the plurality of substrate on the second surface of the hot/cold plate.

20. The method of claim 19, further comprising rotating the fourth substrate independently of the first, second and third substrates.

* * * * *